United States Patent
Nam

(10) Patent No.: US 7,569,481 B2
(45) Date of Patent: Aug. 4, 2009

(54) METHOD FOR FORMING VIA-HOLE IN SEMICONDUCTOR DEVICE

(75) Inventor: Sang Woo Nam, Cheongju-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 6 days.

(21) Appl. No.: 11/445,773

(22) Filed: May 30, 2006

(65) Prior Publication Data

US 2006/0276031 A1    Dec. 7, 2006

(30) Foreign Application Priority Data

Jun. 3, 2005   (KR) .................... 10-2005-0047661

(51) Int. Cl.
*H01L 21/4763* (2006.01)
(52) U.S. Cl. ................ 438/640; 257/744; 257/E21.578
(58) Field of Classification Search ................ 438/640, 438/672–673; 257/774, E21.577, E21.578–E21.579
See application file for complete search history.

(56) References Cited

U.S. PATENT DOCUMENTS

| | | | |
|---|---|---|---|
| 4,750,980 A * | 6/1988 | Hynecek | 438/720 |
| 6,642,153 B1 * | 11/2003 | Chang et al. | 438/725 |
| 6,797,633 B2 * | 9/2004 | Jiang et al. | 438/706 |
| 2002/0081855 A1 * | 6/2002 | Jiang et al. | 438/694 |
| 2004/0002213 A1 * | 1/2004 | Peng | 438/689 |
| 2004/0142535 A1 * | 7/2004 | Chung | 438/396 |
| 2005/0101123 A1 * | 5/2005 | Kumada et al. | 438/637 |
| 2005/0269709 A1 * | 12/2005 | Merchant et al. | 257/774 |
| 2006/0102197 A1 * | 5/2006 | Chiang et al. | 134/1.2 |

\* cited by examiner

*Primary Examiner*—Thao X Le
*Assistant Examiner*—Kimberly Trice
(74) *Attorney, Agent, or Firm*—The Law Offices of Andrew D. Fortney; Andrew D. Fortney

(57) ABSTRACT

Disclosed is a method for forming a via-hole for interconnection of metallization and/or metal wires in a semiconductor device. The present method may include the steps of: (a) forming an insulating layer on a semiconductor substrate including a lower metallization and/or metal wiring; (b) forming a mask (e.g., a photo-resist pattern) on the insulating layer; (c) dry etching the insulating layer using the photo-resist pattern as a mask to form a via-hole in the insulating layer; and (d) in the same dry etching chamber, etching a top portion of the insulating layer in the vicinity of the via-hole with an etchant comprising oxygen and argon.

18 Claims, 4 Drawing Sheets

METHOD FOR FORMING VIA-HOLE IN SEMICONDUCTOR DEVICE

This application claims the benefit of Korean Application No. 10-2005-0047661, filed on Jun. 3, 2005, which is incorporated by reference herein in its entirety.

BACKGROUND OF THE INVENTION

1. Field of the Invention

The present invention relates to semiconductor device manufacturing technology, more specifically, to a method for forming a via-hole for interconnection between multilevel metallization and/or wiring layers.

2. Description of the Related Art

Improvement in the integration of a semiconductor chip produces or results in decreasing the size of circuit elements, and also increasing the length of signal lines for electrical connection between elements, because a plurality of complicated functional elements are integrated on a single chip. However, the length of a signal line should be shortened to improve an operational speed of the integrated circuit. Multilevel interconnection technology is necessary to reduce the length of signal lines, thus enabling complicated functional circuit devices having a lower connection resistance and/or signal propagation time.

Multilevel interconnection technology involves electrically interconnecting metallization and/or wiring including a plurality of layers, using multilevel interconnection materials such as Aluminum (Al), Tungsten (W), and dielectric layers (e.g., such as interlevel dielectric [ILD] or intermetal dielectric [IMD]). A conventional method for interconnecting multilevel metallization comprises the steps of forming a hole in an insulating layer over a metallization layer, and filling the hole with a conductive material. An overlying layer of metallization is then formed over (and generally in contact with) the conductive material. This hole, which when filled electrically connects the overlying and underlying metallization layers to each other, is generally called a via-hole. Via holes can be classified into a vertical type or a taper type, according to the shape of the hole. A vertical type of via-hole, having a sidewall perpendicular to a level (horizontal) surface, is widely employed in that a dry etching process is adaptable to the formation thereof and over-etching is preventable during the dry etching process. Especially, the vertical type of via-hole is advantageous for a higher integration and miniaturization of semiconductor device, because it needs a relatively small formation area.

A conventional via-hole forming and filling method is explained hereinafter with reference to FIGS. 1A to 1C. Firstly, as shown in FIG. 1A, lower metallization (wiring) layer 10 is formed on a semiconductor substrate (not shown), and a diffusion barrier layer 12 such as Ti and/or TiN is formed thereon. Next, an insulating layer 20 such as IMD is formed on an entire surface of the substrate (e.g., by blanket deposition), for the purpose of insulating the metallization and/or wiring. Then, a photoresist pattern 30 for a via-hole is formed on insulating layer 20.

Subsequently, as shown in FIG. 1B, insulating layer 20 is selectively etched by RIE (Reactive Ion Etching) using photoresist pattern 30 as a mask, until a portion of lower metallization layer 10 is exposed, thus resulting in via-hole 40. In such manner as described above, via-hole 40 is formed to be a vertical type, as shown in FIG. 1C. Preferably, via-hole 40 has a small diameter (e.g., substantially equal to the critical dimension for that particular level of metallization) for improvement in the integration of the semiconductor device.

After formation of via-hole 40, it is filled with CVD-Al (Chemical Vapor Deposited Aluminum) or CVD-W (Chemical Vapor Deposited Tungsten) for electrical connection between lower metallization wiring layer 10 and an upper metallization wiring layer to be formed in the subsequent process. Here, a vertical type of via-hole generally has poor step coverage during the metal deposition process (i.e., the gap-fill properties of the via-hole and/or metal deposition method may be unacceptable for large-scale commercial production). It is advantageous to form a vertical type of via-hole having as small a diameter as possible for maximizing integration of semiconductor devices. However, as the diameter thereof becomes smaller, an aspect ratio of via-hole becomes larger. As a result, it becomes more difficult to completely fill a via-hole with CVD-W or CVD-Al.

SUMMARY OF THE INVENTION

It is, therefore, an object of the present invention to provide a method for forming a via-hole to have a round top profile, thus enabling and/or facilitating filling the via-hole with a conductive material for interconnection of multilevel metallization and/or wiring.

Another object of the present invention is to provide a method for forming a via-hole, wherein polymer residues formed during an etching process can be considerably and/or substantially removed in a dry etch chamber. The present method enables a decrease in the processing time of an ashing process, an increase in the cleaning period for the dry etch chamber, and an improvement of the yield of semiconductor devices.

To achieve the above objects, an embodiment of a method for forming a via-hole (e.g., for interconnection of metallization in a semiconductor device), according to the present invention, comprises the steps of: (a) forming a mask on an insulating layer on a semiconductor substrate, including a lower metallization layer; (b) etching the insulating layer in a chamber to form a via-hole; and (c) etching a top portion of the insulating layer in the vicinity of the via-hole using an etchant comprising oxygen and argon.

Especially, the oxygen and argon in the step (c) can effectively remove a by-product formed by an etching reaction in the dry etching step (b). Preferably, steps (b) and (c) are performed in-situ in the same dry etching chamber. In addition, flow rates of the gases in the etching chamber in step (c) are respectively in a range of from 50 to 500 sccm (standard cc/min), and a processing pressure in the etching chamber in step (c) is in a range of from 10 to 200 mTorr.

Furthermore, the method according to the present invention can further comprise the steps of: (d) completely removing any remaining mask after step (c); and (e) forming a conductive plug in the via-hole. Here, the conductive plug preferably comprises CVD-W or CVD-Al.

These and other aspects of the invention will become evident by reference to the following description of the invention, often referring to the accompanying drawings.

DETAILED DESCRIPTION OF THE INVENTION

Figure 1A:
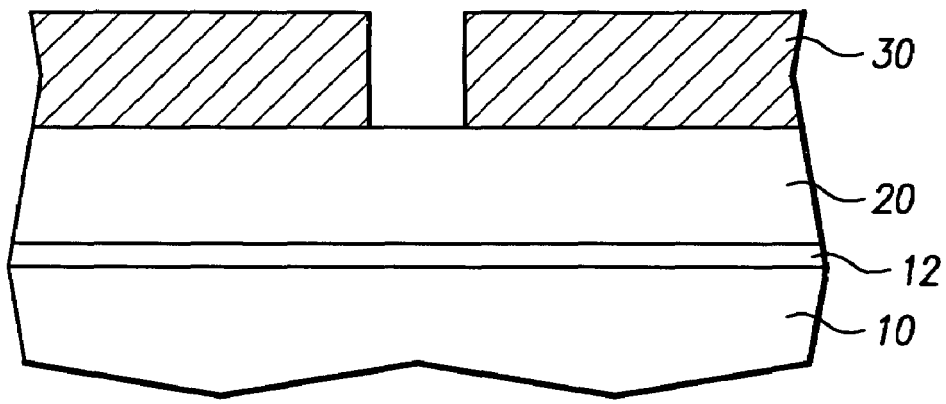
FIGS. 1A to 1C are cross-sectional views illustrating a conventional method for forming a via-hole in a semiconductor device.
Figure 1B:
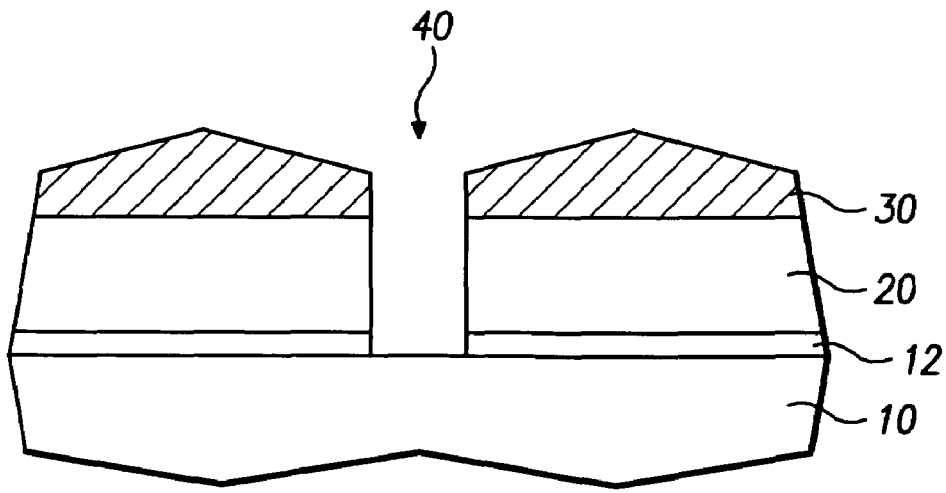
Figure 1C:
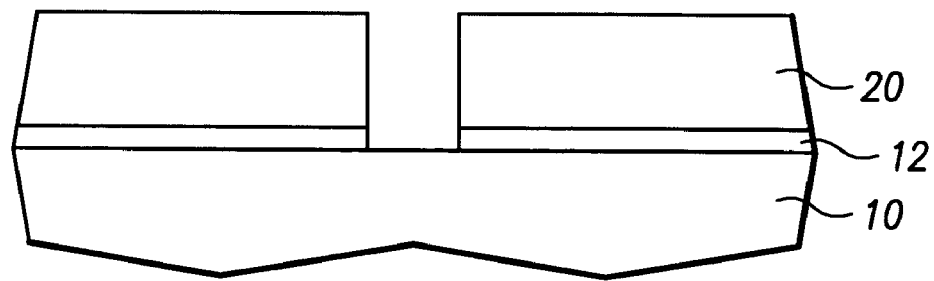
Figure 2A:
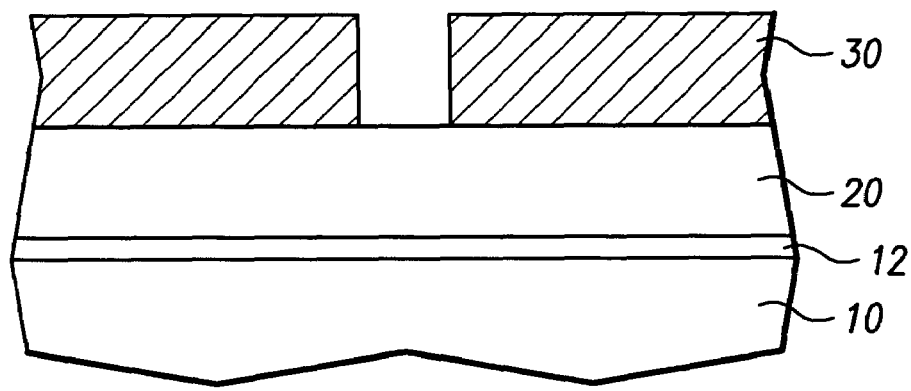
FIGS. 2A to 2D are cross-sectional views illustrating a method for forming a via-hole in a semiconductor device, according to the present invention.

Referring to FIG. 2A, lower metallization layer 10 is formed on a semiconductor substrate (not shown), and a diffusion barrier layer 12 such as Ti and/or TiN (preferably a Ti layer with a TiN layer thereon) is formed thereon. Next, an insulating layer 20 such as an IMD is formed over an entire surface of the substrate, for the purpose of insulating metallization. The insulating layer 20 may comprise one or more layers of a silicon oxide, such as silicon dioxide (which may be optionally doped with fluorine, boron, phosphorous, or a mixture of boron and phosphorous), silicon nitride, silicon oxynitride, silicon-rich oxide, etc. In one embodiment, insulating layer 20 comprises a lower silicon nitride or silicon-rich oxide layer, with one or more layers of a (doped) silicon dioxide thereon. In one example, the (doped) silicon dioxide comprises a bulk layer of fluorosilicate glass (FSG) with layers of undoped silicate glass (USG) above and below the FSG layer. Then, a mask (e.g., a photo-resist pattern) 30 for a via-hole is formed on insulating layer 20, typically by conventional photolithographic exposure and development.

Figure 2B:
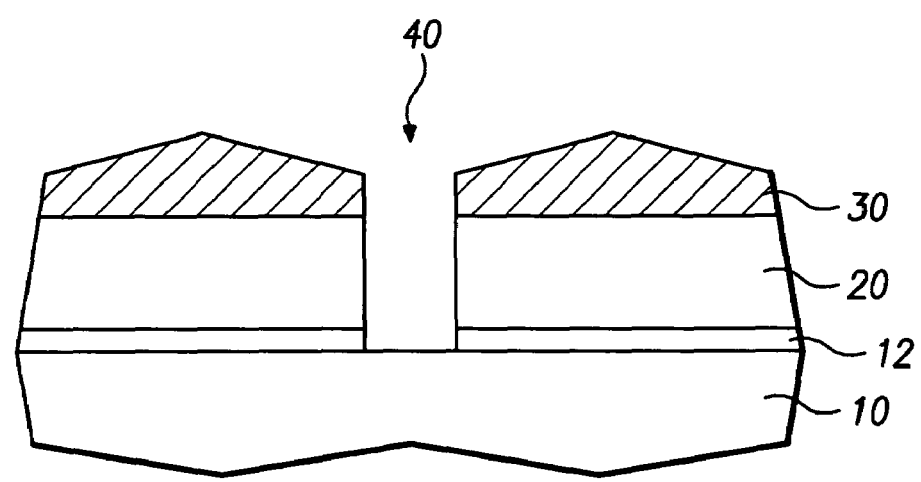

Subsequently, as shown in FIG. 2B, an exposed portion of insulating layer 20 is selectively etched (e.g., by reactive ion etching [RIE]) using, e.g., photo-resist pattern 30 as a mask, until a portion of lower metallization wiring layer 10 is exposed, thus resulting in via-hole 40. In such manner as described above, a vertical type via-hole 40 is formed.

After formation of via-hole 40, the process for enlarging an opening at a top portion of via-hole 40 is performed, using an etchant comprising oxygen and argon (e.g., Ar gas and one or more oxygen atom sources, such as dioxygen [oxygen gas], ozone [$O_3$], nitrous oxide [$N_2O$], nitrogen monoxide [NO], nitric oxide [$NO_2$], $HeO_2$, etc.), in the same etching chamber as where via-hole 40 is formed by etching insulating layer 20. Preferably, the enlarging process of via-hole 40 is performed in-situ in the same etching chamber (e.g., without breaking vacuum), under processing conditions comprising: a pressure of from about 10 mTorr to about 200 mTorr; oxygen source gas (e.g., $O_2$ gas) at a flow rate of from about 50 sccm (standard cc/min) to about 500 sccm; Ar gas at a flow rate of from about 50 sccm to about 500 sccm; a RF power of from about 100 Watt to about 500 Watt; a temperature of from about −20° C. to about 60° C.; and a processing time of from about 10 seconds to about 60 seconds.

Figure 2C:
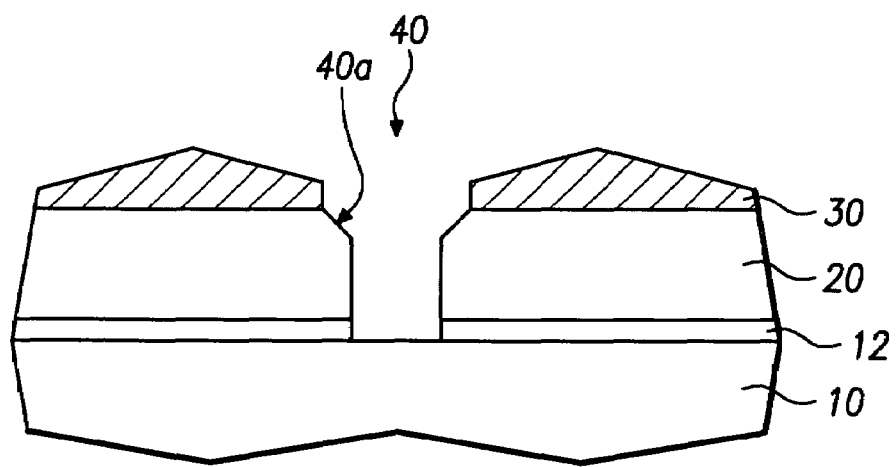

Under these processing conditions, the pressure range is generally selected to smoothly form a plasma, an oxygen atom source such as $O_2$ gas may remove polymer residues, and argon gas may round a top portion of via-hole 40, perhaps by substantially physical etch mechanism (e.g., sputter etching). Here, rounding the top portion of via-hole 40 results in enlarging an opening of via-hole 40. In other words, a diameter of the opening at the top portion of via-hole 40 becomes larger than a diameter at other portions of via-hole 40 (e.g., lower portions along the sidewall of via-hole 40). FIG. 2C shows the opening of via-hole 40 enlarged at the top portion thereof. Here, reference numeral 40a indicates a portion of insulating layer 20 (i.e., the top portion of via-hole 40) which has been rounded with the etchant of the present invention (e.g., argon gas in the oxygen-argon mixture).

Meanwhile, in a conventional method, photo-resist remaining after formation of via-hole by dry etching is removed in a separate (or additional) ashing chamber using an oxygen plasma. However, during the dry etching process, by-products such as polymers may occur to a considerable extent (perhaps by a reaction between photo-resist material and one or more of the ingredients of insulating layer 20 and/or a conventional dry etching reagent, such as a fluorocarbon gas). The by-product (e.g., polymer residue) may remain on the mask (e.g., photo-resist pattern) and also in the via-hole 40. In the case where the by-products remain on the photo-resist pattern, it becomes difficult to remove the photo-resist pattern in the subsequent ashing process. In addition, the polymer residues remaining in via-hole 40 may prohibit (i.e., cause a failure of) electrical connection between a conductive plug and the lower metallization layer. Accordingly, an ashing process and additional wet cleaning process using chemicals, such as aqueous hydrofluoric acid (HF), may be used to more completely remove the polymer residues.

However, according to the present invention, after the dry etching process for via-hole 40, insulating layer 20 is treated with an oxygen source and argon in the same dry etching chamber in which the via hole 40 was formed. In this process, polymer residues resulting from reaction of photo-resist and species in insulating layer 20 and/or a conventional dry etching reagent can be effectively removed, and simultaneously the top opening of via-hole 40 can be enlarged. More specifically, oxygen (preferably oxygen gas) can remove considerable amounts of photo-resist materials and by-products such as polymer residues, especially in the vicinity of the top portion of via-hole 40, thereby exposing the top portion of insulating layer 20. Then, the exposed top portion of insulating layer 20 is sputter-etched by argon gas in the plasma, thus resulting in enlargement of the top opening of via-hole 40. Also, polymer ingredients on photo-resist pattern 30 can be effectively removed by oxygen (e.g., $O_2$ gas) so that photo-resist pattern 30 can be easily removed in the subsequent ashing process. Moreover, the present process can prevent contamination of the etching chamber due to the polymer residues. As a result, the dry etching chamber can be maintained more cleanly over a longer time of operation, which is an additional advantage of the present invention.

Figure 2D:
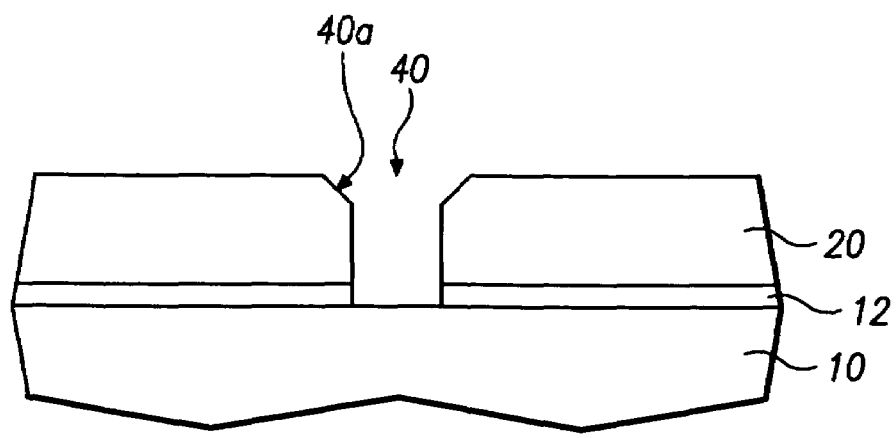

After finishing the process using oxygen source-argon mixture, a remaining portion of photo-resist pattern 30 is removed (e.g., by ashing in a typical ashing chamber). FIG. 2D illustrates the via hole with the photo-resist pattern 30 completely removed. According to the present invention, certain photo-resist ingredients that tend to be resistant to removal without extra processing (one or more etching, ashing and/or cleaning steps) can be primarily and effectively removed in the dry etching chamber, thereby reducing the processing time of this ashing process relative to that of a conventional ashing process. Moreover, it is not necessary to perform an additional wet cleaning process for removal of etching by-products, because such by-products (e.g., polymer residues) on the photo-resist pattern may be removed in the preceding (via hole-rounding) process. However, when the additional wet cleaning process is performed with an ashing process, by-products such as is polymer residues can still be removed, but in a shorter processing time.

After removal of photo-resist pattern 30, via-hole 40 is filled with a conductive material (e.g., CVD-W or CVD-Al, preferably with one or more adhesion and/or diffusion barrier layers thereunder, such as a conventional Ti adhesion layer/TiN diffusion barrier structure) for electrical connection between lower and upper metallization layers. Especially, the top opening of via-hole is enlarged so that this filling process of via-hole can be effectively performed.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method for forming a via-hole, comprising the steps of:
    (a) forming a mask on an insulating layer on a semiconductor substrate, including a lower metallization or wiring layer, wherein the mask comprises a photo-resist pattern and the insulating layer comprises at least one of the following: silicon dioxide silicon nitride, silicon oxynitride, or silicon-rich oxide;
    (b) using the mask, dry etching the insulating layer in a chamber to form a via-hole in the insulating layer, wherein a polymer residue from the photo-resist pattern remains in the via-hole; and
    (c) simultaneously etching a top portion of the insulating layer, etching a portion of the mask in the vicinity of the via-hole, and removing the polymer residue, in situ in the etching chamber, with an etchant comprising oxygen and argon.

2. The method of claim 1, wherein the etchant comprises oxygen gas and argon gas.

3. The method of claim 2, wherein flow rate of each of the oxygen and argon gases in the chamber in step (c) is in a range of from 50 to 500 sccm (standard cc/mm).

4. The method of claim 1, wherein a processing pressure in the chamber in step (c) is in a range of from 10 to 200 mTorr.

5. The method of claim 1, further comprising the steps of:
    (d) completely removing any mask remaining after the step (c); and
    (e) forming a conductive plug in the via-hole.

6. The method of claim 5, wherein the conductive plug comprises CYD-W or CVD-Al.

7. The method of claim 1, wherein the insulating layer comprises a silicon dioxide layer doped with at least one of the following: fluorine, boron or phosphorus.

8. The method of claim 1, wherein the insulating layer comprises a layer of fluorosilicate glass.

9. The method of claim 8, wherein the insulating layer comprises layers of undoped silicate glass above and below the layer of fluorosilicate glass.

10. A method for forming a via-hole for interconnection of metallization wirings in a semiconductor device, comprising the steps of:
    (a) forming a mask on an insulating layer on a semiconductor substrate, including a lower metallization or wiring layer, wherein the mask comprises a photo-resist pattern and the insulating layer comprises at least one of the following: silicon dioxide silicon nitride, silicon oxynitride, or silicon-rich oxide;
    (b) using the mask, dry etching the insulating layer in a chamber to form a via-hole in the insulating layer, wherein a polymer residue from the photo-resist pattern remains in the via-hole;
    (c) simultaneously etching a top portion of the insulating layer, etching a portion of the mask in the vicinity of the via-hole, and removing the polymer residue, in-situ in the etching chamber, with an etchant comprising oxygen and argon gases;
    (d) completely removing any remaining mask; and
    (e) forming a conductive plug in the via-hole.

11. The method of claim 10, wherein the etchant comprises oxygen gas and argon gas.

12. The method of claim 11, wherein flow rate of each of the oxygen and argon gases in the dry etching chamber of the step (c) is in a range of from 50 to 500 sccm (Standard cc/mm).

13. The method of claim 12, wherein a processing pressure in the chamber in step (c) is in a range of from 10 to 200 mTorr.

14. The method of claim 10, wherein a processing pressure in the chamber in step (c) is in a range of from 10 to 200 mTorr.

15. The method of claim 10, wherein the conductive plug comprises CYD-W or CVD-Al.

16. The method of claim 10, wherein the insulating layer comprises a silicon dioxide layer doped with at least one of the following: fluorine, boron or phosphorus.

17. The method of claim 10, wherein the insulating layer comprises a layer of fluorosilicate glass.

18. The method of claim 17, wherein the insulating layer comprises layers of undoped silicate glass above and below the layer of fluorosilicate glass.

* * * * *